United States Patent [19]

Georgiou et al.

[11] Patent Number: 5,668,830

[45] Date of Patent: *Sep. 16, 1997

[54] DIGITAL PHASE ALIGNMENT AND INTEGRATED MULTICHANNEL TRANSCEIVER EMPLOYING SAME

[75] Inventors: Christos John Georgiou, White Plains; Thor Arne Larsen, Hopewell Junction; Ki Won Lee, Yorktown Heights, all of N.Y.

[73] Assignee: International Business Machines Corporation, Armonk, N.Y.

[ * ] Notice: The term of this patent shall not extend beyond the expiration date of Pat. No. 5,550,860.

[21] Appl. No.: 642,570

[22] Filed: May 3, 1996

Related U.S. Application Data

[60] Continuation of Ser. No. 420,102, Apr. 11, 1995, Pat. No. 5,550,860, which is a division of Ser. No. 152,108, Nov. 12, 1993, Pat. No. 5,533,072.

[51] Int. Cl.$^6$ ........................................... H04L 25/34
[52] U.S. Cl. ........................ 375/220; 375/356; 370/517
[58] Field of Search ........................... 370/105, 105.2, 370/517, 516; 375/354, 356, 219, 260, 220, 359; 327/162, 163, 144, 145, 147

[56] References Cited

U.S. PATENT DOCUMENTS

| | | | |
|---|---|---|---|
| 4,412,342 | 10/1983 | Khan et al. | 375/107 |
| 4,754,164 | 6/1988 | Flosa ret al. | 327/152 |
| 4,916,717 | 4/1990 | Sackman, III et al. | 375/356 |
| 4,965,815 | 10/1990 | Boudewings | 375/119 |
| 4,972,444 | 11/1990 | Melrose et al. | 375/120 |
| 4,982,110 | 1/1991 | Yokogawa et al. | 307/269 |
| 5,003,562 | 3/1991 | Van Driest et al. | 375/119 |
| 5,022,056 | 6/1991 | Henderson et al. | 375/119 |
| 5,024,967 | 6/1991 | Cox et al. | 375/119 |
| 5,036,230 | 7/1991 | Bazes | 307/527 |
| 5,039,950 | 8/1991 | McDermott | 328/62 |
| 5,056,120 | 10/1991 | Taniguchi et al. | 375/118 |
| 5,066,868 | 11/1991 | Doty, II et al. | 307/262 |
| 5,117,424 | 5/1992 | Cohen et al. | 375/356 |
| 5,245,637 | 9/1993 | Gersbach et al. | 327/141 |
| 5,278,873 | 1/1994 | Lowery et al. | 327/141 |
| 5,408,473 | 4/1995 | Hutchinson et al. | 375/260 |
| 5,481,573 | 1/1996 | Jacobowitz et al. | 375/356 |
| 5,533,072 | 7/1996 | Georgiou et al. | 375/371 |
| 5,535,240 | 7/1996 | Carney et al. | 375/219 |
| 5,550,860 | 8/1996 | Georgiou et al. | 375/220 |

OTHER PUBLICATIONS

Cordell, Robert R., "A 45–Mbit/s CMIS VLSI Digital Phase Aligner", IEEE Journ. of Solid–State Cir., vol. 23, No. 2, pp. 323–229, Apr. 1988.

Kim et al., "A 30–MHz Hybrid Analog/Digital Clock Recovery Circuit in 2–βm CMOS", IEEE Journ. of Solid–State Cir., vol. 25, No. 6, pp. 1385–1394, Dec. 1990.

(List continued on next page.)

*Primary Examiner*—Melvin Marcelo
*Assistant Examiner*—Jean B. Corrielus
*Attorney, Agent, or Firm*—Heslin & Rothenberg, P.C.

[57] ABSTRACT

A synchronizer and phase aligning method that provide signal smoothing and filtering functions as well as slip-cycle compensation, and allow for multichannel digital phase alignment, bus deskewing, integration of multiple transceivers within a single semiconductor chip, etc. A delay line produces a plurality of delayed input replicas of an input signal. A clock phase adjuster produces a sampling clock signal from a reference clock signal. The sampling clock signal may be phase adjusted to be offset from the input signal. After certain smoothing and filtering functions, selection logic detects a phase relationship between the sampling clock signal and the input replicas and identifies a closely synchronized signal for output. Using this identified replica signal, slip-cycle compensation and retiming logic outputs a compensated data output signal synchronized with the reference clock signal. Also, an integrated multiple transceiver produced using the phase alignment technique is presented.

5 Claims, 8 Drawing Sheets

OTHER PUBLICATIONS

Crow et al., "A GaAs MESFET 1C for Optical Multiprocesssor Networks", IEEE Trans. on Elecctron Devices, vol. 36, No. 2, pp. 263–268, Feb. 1989.

Hao et al., "A High Lock–In Speed Digital Phase–Locked Loop", IEEE Trans. on Comm., vol. 39, No. 3, pp. 365–368, Mar. 1991.

Hickling, Ronald M., "A Single Chip 2 Gbit/s Clock Recovery Subsystem for Digital Communications", pp. 493–497.

SEQUENTIAL PHASE DETECTOR

DIGITAL PHASE ALIGNMENT AND INTEGRATED MULTICHANNEL TRANSCEIVER EMPLOYING SAME

CROSS-REFERENCE TO RELATED APPLICATIONS

This application is a Continuation of application Ser. No. 08/420,102, filed Apr. 11, 1995, now U.S. Pat. No. 5,550,860 which itself is a Division of application Ser. No. 08/152,108, filed Nov. 12, 1993, now U.S. Pat. No. 5,533,072.

TECHNICAL FIELD

The present invention relates in general to data communications and, more particularly, to a digital phase aligner and alignment method which provide jitter and noise filtering and slip-cycle compensation, and which allow multichannel digital phase alignment, bus deskewing, and integration of multiple transceivers within a single semiconductor chip, etc.

BACKGROUND ART

As the operating frequency of complex digital communication and data transfer systems increases, a major technical challenge has been to operate an entire system in a synchronous manner. A typical complex digital system consists of various subsystems where the exchange of information among the subsystems is synchronized by a fixed frequency and fixed phase global reference signal (i.e., "reference clock") available to all subsystems. When the operating frequency extends above several hundred megahertz (MHz), however, it is difficult within reasonable hardware costs to distribute the reference clock to the various subsystems and still maintain an acceptable phase difference (i.e., "clock skew"). This is mainly due to the inherent electrical propagation delay along the various physical signal paths among the subsystems.

To alleviate such stringent synchronization requirements it has been a growing trend to limit the synchronous operations to within each subsystem, while providing interactions among subsystems of the complex network asynchronously (i.e., "asynchronous interconnections"). Typically, a subsystem is a collection of VLSI modules placed close together such that their electrical signal path delays are small enough to perform their operations in a synchronous manner at a given clock frequency above several hundred megahertz (MHz), without paying the high cost penalty otherwise associated with full network synchronous clock distribution. Each localized synchronous subsystem only receives a frequency-locked reference clock instead of a clock which is both frequency-locked and phase-locked. As a result, elaborate and costly distribution of a high speed clock signal throughout a network is avoided.

To exchange information asynchronously among synchronous subsystems, each synchronous subsystem should have suitable transmitter and receiver modules to transmit data to and retrieve transmitted data from other subsystems of the network. Again, this assumes the absence of a traditional frequency-locked and phase-locked global reference clock. Ideally, the receiver module should retrieve data within a few bit-time periods under the presence of frequent phase discontinuity on the input bit-stream. Furthermore, it is highly desirable to combine the transmitter and receiver modules in a single transceiver macro, and to have multiple transceiver macros integrated in a single chip without the need for analog or high-precision digital circuits. This is because of the chip's repeated use in the system as a building block.

Prior-art approaches to data retrieval from a serialized bit stream can be grouped into two categories: (1) phase-locked loop approaches (e.g., W. C. Lindsey and C. M. Chie, "A Survey of Digital Phase-Locked Loops," IEEE Proc. Vol. 69, pp. 410–431, April 1981; R. M. Hickling, "A Single Chip 2 Gbit/s Clock Recovery Subsystem for Digital Communications," Proc. of RF Technology Expo. 88, published by Cardiff Publishing, Anaheim, Calif., pp. 493–497, Feb. 10–12, 1988; J. D. Crow, et al., "A GaAs MESFET IC for Optical Multiprocessor Networks," IEEE Trans. Electron Devices, Vol. 36, No. 2, pp. 263–268, February 1989; S. Hao and Y. Puqiang, "A High Lock-In Speed Digital Phase-Locked Loop," IEEE Trans. of Comm., Vol. 39, No. 3, pp. 365–368, March 1991); and (2) phase-alignment approaches (such as R. R. Cordell, "A 45 M-bit/s CMOS VLSI Digital Phase Aligner," IEEE J. of Solid-State Circuits, Vol. 23, No. 2, pp. 323–328, April 1988; and B. Kim, D. N. Helman, P. R. Gray, "A 30-MHz Hybrid Analog/Digital Clock Recovery Circuit in 2-um CMOS," IEEE J. of Solid-State Circuits, Vol. 25, No. 6, pp. 1385–1394, December 1990).

In a phase-locked loop approach, the goal is to generate a frequency-locked and phase-locked timing signal (i.e., reference clock) locally by adjusting the frequency and phase of an internal oscillator (VCO) to that of a received data bit stream. Use of a phase-locked loop approach in a transceiver for high speed interconnection applications is undesirable since such circuits inherently require a very long re-synchronization time (e.g., on the order of a few hundred bit-times) and require high precision analog components, such as digital-to-analog or analog-to-digital converters, along with a voltage-controlled or current-controlled oscillator. Furthermore, existing data recovery schemes based on phase-locked loop approaches prohibit the integration of a transmitter module and a receiver module in a single chip due to the interference and noise experienced with two voltage-controlled oscillators (VCOs) (one for the receiver and another for the transmitter) on the same chip.

In general, phase-locked loops are employed mainly in applications where signal quality is poor and re-synchronization time is unimportant, such as telecommunication applications. Unlike the telecommunication environment, however, an asynchronous interface environment among subsystems within a complex digital system provides better signal quality at the receiving end. Also, only a frequency-locked reference clock signal, having a lower frequency than the frequency of data transfer, is generally available within a digital system, i.e., without additional hardware cost.

To achieve fast re-synchronization based on the characteristics of asynchronous interconnects within a digital system, several approaches employing phase-alignment have been proposed. These approaches retrieve data from an input bit-stream using an externally supplied, frequency-locked clock signal. By way of example, reference W. M. Cox and M. A. Fischer, "Metastable-free Digital Synchronizer With Low Phase Error," U.S. Pat. No. 5,034,967, Jul. 23, 1991; R. D. Henderson and R. K. Yin, "Method and Structure for Digital Phase Synchronization," U.S. Pat. No. 5,022,056, Jun. 4, 1991; C. G. Melrose and J. D. Rose, "Digital Phase-Locked Device and Method," U.S. Pat. No. 4,972,444, Nov. 20, 1990; and A. J. Boudewijns, "Phase Detection Circuit for Stepwise Measurement of a Phase Relation," U.S. Pat. No. 4,965,815, Oct. 23, 1990.

Referring to FIG. 1, these approaches typically have in common the following layout 10:

1. Acquisition of a set of lead-lag, binary phase state variables ('n' variables), which represent the binary phase relationship (lead or lag) with respect to the reference clock, using an input delay module 12 and an array of flip-flops 14 (phase sampling flip-flops), 2. Processing of the lead-lag phase state information to select an optimally delayed input signal among the delayed input replicas, such that both the reference clock and the selected input replica are in phase (output selection logic 16), and 3. Selection of an output among the delayed input replicas provided by input delay module 12 using an 'N-to-1' multiplexer (N-to-1 Mux 18).

The acquisition of a set of phase state variables, processing of the lead-lag phase state variables, and selection of an optimal output with respect to the reference clock signal are each well known functions. Further, a number of output selection algorithms are available in the open literature, as represented by the above-referenced United States patents.

Unfortunately, all known phase-alignment approaches result in significant technical difficulties and fail to produce an error free output data-bit stream under real operating conditions, i.e., under the presence of random phase jitter and/or noise on the input signal. This is due to the approaches' inherent phase sampling mechanism ('Modulo $2\pi$ phase error measurement'), where phase error between the input signal and reference clock is only measured within an interval of 0 to $2\pi$. Note that 'one bit-time' in the time domain is equivalent to $2\pi$ in the phase domain. For example, when an input signal transition randomly occurs and input signal noise increases, the phase error from a previously adjusted cycle may result in prior art phase aligners slipping a cycle, i.e., slipping one bit-time. The net effect of a slipped cycle on a phase aligner output is a data bit error, wherein either a data bit is dropped ('negative slip' if the phase error increased by $-2\pi$) or a data bit is duplicated ('positive slip' if the phase error increased by $-2\pi$). Output bit error due to a slipped cycle(s) using prior art phase-alignment approaches becomes worse when the phase difference between the input signal and the sampling clock signal is close to the boundary of the reference bit-time, i.e., 0 or $2\pi$.

In addition, most known phase-alignment approaches are sensitive to circuit element variations when adjusting the phase of a reference clock signal to sample an input signal, primarily due to the art's difficulty in processing a large number of phase state variables. Ideally, an optimally delayed input replica should be selected by decoding $2^N$ possible phase states (out of N phase state samples) during a bit-time to ensure against output bit error due to flip-flop metastability. Since decoding of all possible phase state combinations is impractical using heretofore known approaches, a small number of phase states of interest are usually decoded. To guarantee the selection of only one signal from 'n' phase shifted signals, the prior art thus assumes that there are less than one or two incorrect phase samplings caused by metastability of the phase sampling flip-flops. However, since there is typically a high possibility of having multiple incorrect phase samplings around transitions of the input signal at higher data rates, it would be desirable to consider all 'n' phase state variables to select an appropriate phase shifted variable, while still providing fast phase synchronization at high speed operation. Further, the prior phase alignment approaches typically require precision analog or digital circuit components, and provide no slip-cycle compensation. The synchronizing technique disclosed herein addresses all of these problems, limitations and omissions of known phase sampling approaches.

SUMMARY OF THE INVENTION

Briefly summarized, the present invention comprises in one aspect a synchronizer for phase aligning an input signal, having a data transition, with a reference clock signal. In this first aspect a delay circuit having an input coupled to receive the input signal is provided. The delay circuit includes a plurality of serially connected delay stages each of which outputs a corresponding delayed, input replica as the input signal propagates through the delay circuit. A clock adjuster receives the reference clock signal and produces therefrom a sampling clock signal having a clocking transition. The sampling clock signal has the same frequency as the reference clock signal and a phase offset from the input signal. The phase of the sampling clock signal is offset from the reference clock signal when the reference clock signal is substantially in phase with the input signal. A selector detects a phase relationship between the sampling clock signal and at least some of the input replicas and identifies based thereon one of the input replicas as closely synchronized with the sampling clock signal. The identified one of the input replicas comprises a synchronous replica. An output means retimes and outputs the synchronous replica as a data output signal closely synchronized with the reference clock signal. Retiming of the synchronous replica includes compensating for the clock adjuster's phase offset of the sampling clock signal relative to the reference clock signal when the reference clock signal is substantially in phase with the input signal.

In another aspect, a synchronizer for phase aligning an input signal relative to a reference clock signal is provided. This synchronizer includes a delay circuit having an input coupled to receive the input signal and a plurality of serially connected delay stages each of which outputs a correspondingly delayed, input replica as the input signal propagates through the delay circuit. Coupled to the delay circuit is a means for acquiring phase states for each input replica relative to the reference clock signal. The acquiring means includes means for evaluating the acquired phase states, beginning with a phase state corresponding with a least delayed input replica, for detecting a first phase state transition and when detected, for setting each acquired phase state subsequent thereto to a predefined, set phase state. A selector, coupled to the means for acquiring phase states, identifies based on phase states one of the input replicas as closely synchronized with the reference clock signal. The identified one of the input replicas comprises a synchronous replica. Finally, means for outputting the synchronous replica as a data output signal synchronized with the reference clock signal is provided.

In still another aspect, the invention comprises a synchronizer for phase aligning an input signal with the reference clock signal. A delay circuit is again employed that outputs a plurality of input replicas as the input signal propagates therethrough. A selector is coupled to the delay circuit for identifying one of the input replicas as closely synchronized with the reference clock signal. This identified input replica comprises a synchronous replica. Compensation means evaluates the synchronous replica for cycle slip and outputs based thereon a slip-cycle compensated data output signal whenever a cycle slip is determined. The slip-cycle compensated data output signal is closely synchronized with the reference clock signal.

To restate, the synchronizing technique of the present invention comprises an all digital implementation. Further, pipeline processing makes feasible high speed VLSI technology implementations, such as GaAs or CMOS. The synchronizing technique reduces effects of sampling flip-flop metastability, random jitter on the input signal and VLSI process variations inherent in the delay line. Processing neither relies on precision analog components nor requires complex signal processing techniques. Data output can be resynchronized within a few bit-times after transition of the input data signal. The central concepts are applicable to synchronization of multiple input bit-streams with respect to a reference clock signal to perform such functions as bus deskewing, or combining of striped data from multiple links. One significant application of the synchronizing technique comprises the integration of multiple transceivers on a single chip. A digital phase aligner in accordance with the present invention is easily integrated to other synchronous components within a subsystem of a communications or digital system. Implementation is cost effective for repeated use of the synchronization technique as a building block within the system. Finally, compensation for both negative and positive cycle slips due to momentary large changes in input signal phase is presented.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
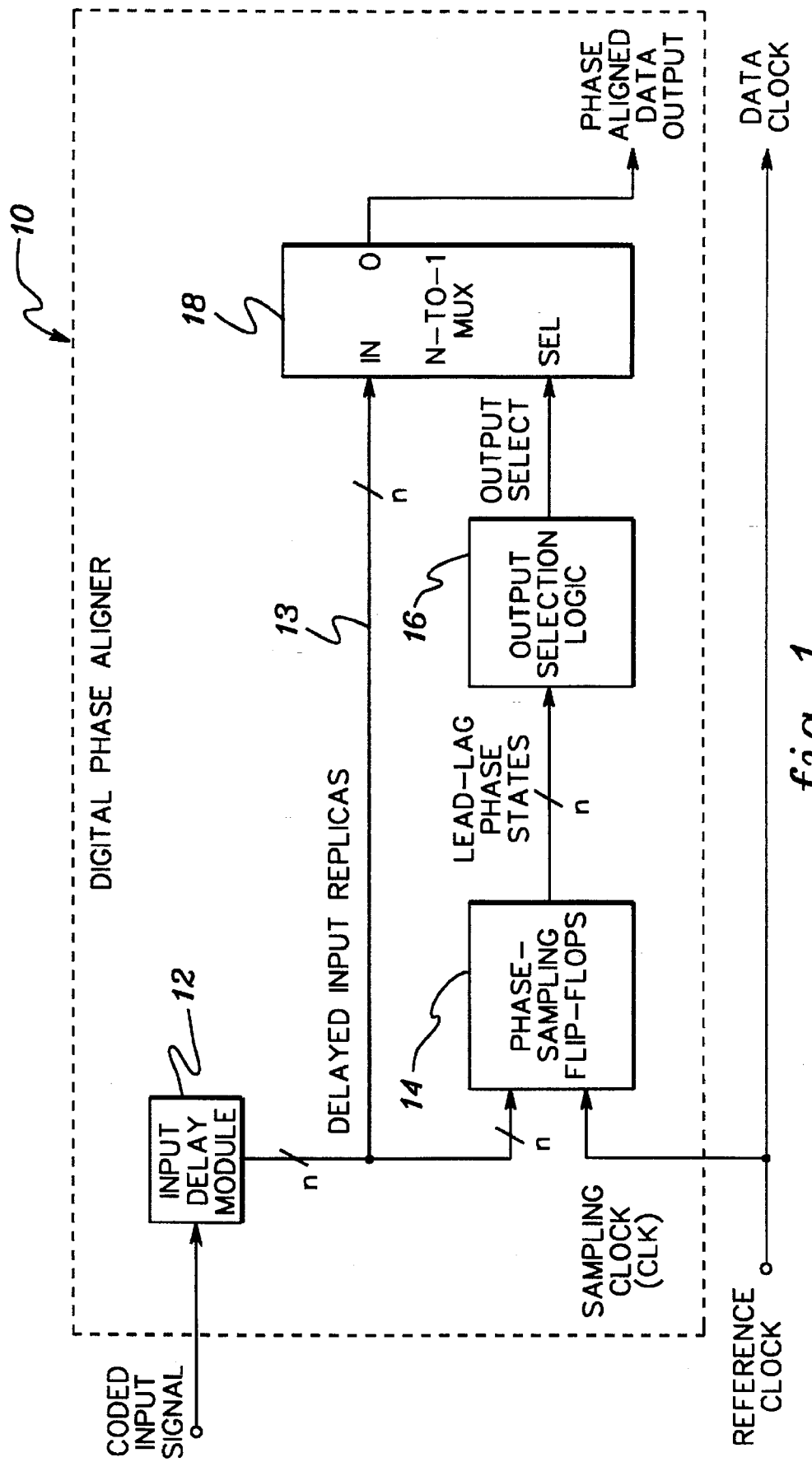
FIG. 1 is a block diagram of a conventional digital phase aligner.

As noted, digital phase synchronization based on a delay line's 'n' phase shifted signals (herein 'n' input replicas) and a reference signal, generally requires two principal functions. First, the acquisition of 'n+1' phase state variables; and second, the selection of an appropriate phase shifted signal from the 'n' phase shifted signals by decoding the 'n+1' phase state variables. The 'n+1' phase state variables represent the binary phase relationship (i.e., lead or lag) of each successively delayed transition of the delay line relative to the reference signal. This relationship is determined by sampling the input signal and the phase shifted signals from each delay tap of the delay line and comparing these sampled signals with the reference signal in a well known fashion. As a result, there can be $2^n$ possible phase states out of the 'n' phase state variables.

Since at high data rates there is a significant possibility of having multiple incorrect phase samplings occur around transitions of the input signal, it would be preferable to scan all phase state variables to select an appropriate phase shifted input replica signal, while still providing fast phase synchronization for support of high speed operation. The processing method presented herein scans all phase state variables and applies thereto certain novel smoothing and selection steps in a pipelined fashion. In addition, before output of phase aligned data, retiming logic implementing slip-cycle compensation is employed.

In the example described below, data is retrieved from a serial, encoded bit-stream (e.g., NRZ encoded), using the novel high-speed decision and phase alignment processing of the present invention. A synchronized data bit-stream (output data) is produced from an asynchronous data bit-stream (input data) through the use of an externally supplied reference clock signal by aligning the phase of the input bit-stream to that of the clock. As a result, the output bit-stream can be processed synchronously by local logic of a subsystem within a data processing or communications network. The processing presented lends itself to an all-digital, high-speed data retrieval circuit implementation.

Three assumptions are needed to implement processing in accordance with this invention. These assumptions are imposed at the receiving end of asynchronous data within a data communications network to implement bit synchronization pursuant to the invention. The assumptions are:

1. A frequency-locked reference clock is available to the receiving end. The term 'frequency-locked' means that the frequency mismatch between the input data rate(s) and the reference clock signal is within a certain predefined tolerance, which is implementation specific. In general, the upper bound of the tolerance is such that the accumulated phase shift due to frequency mismatch between two successive input signal transitions is small (e.g., much smaller than one data bit-time).

2. There are sufficient input signal transitions on the input data bit-stream such that any phase shift between two successive signal transitions (for example, caused by temporary drift in electrical characteristics of the components along the signal path) is small, again much smaller than one data bit-time.

3. The serialized input signal contains small phase jitter such that reasonable eye openings can be maintained.

Figure 2:
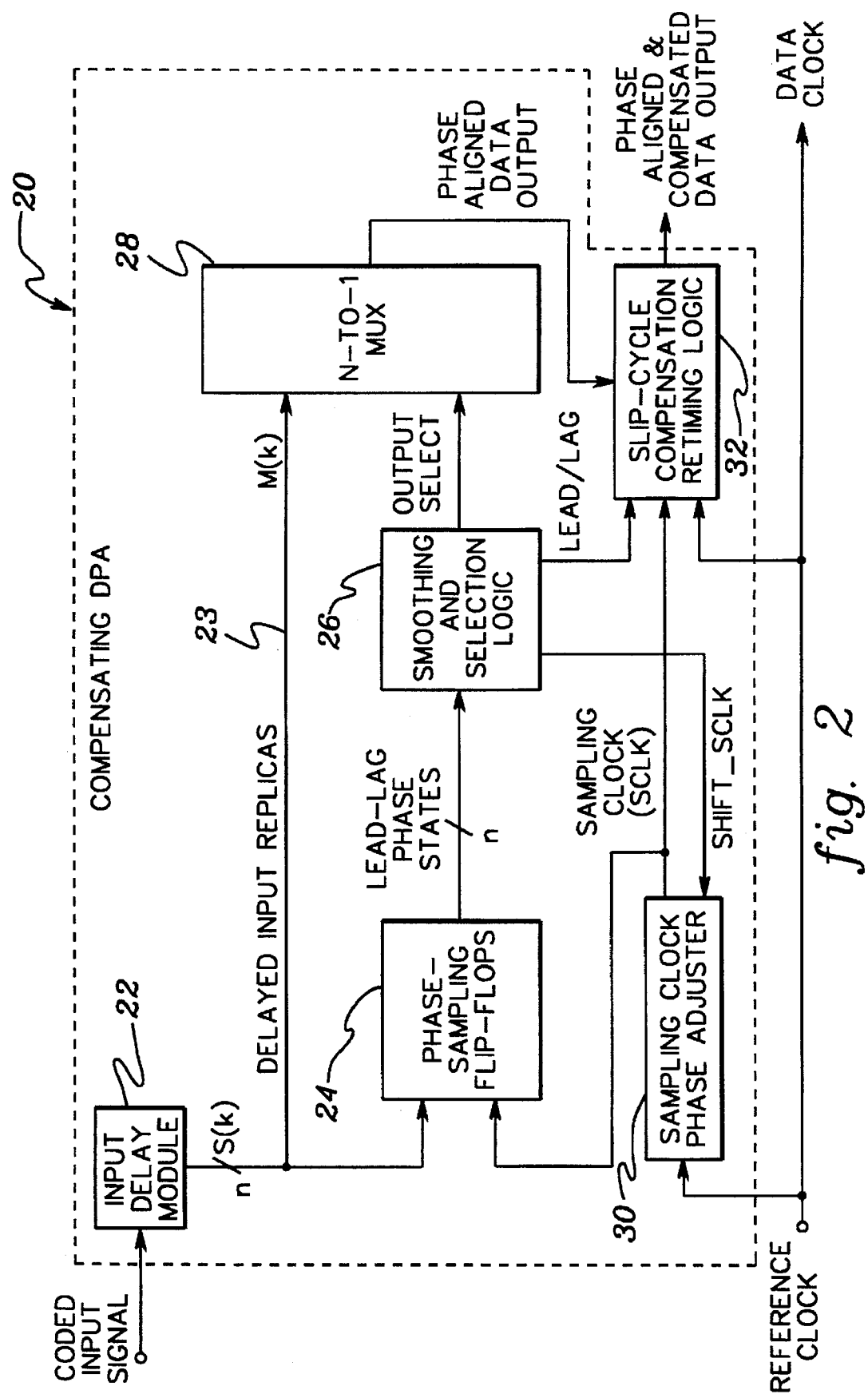
FIG. 2 is a block diagram of a compensating digital phase aligner in accordance with the present invention.

One embodiment of a compensating digital phase aligner (DPA) 20 in accordance with the present invention is shown in FIG. 2. Compensating DPA 20 receives as input a serialized, encoded input signal and a reference clock signal. Output from the phase aligner is a phase aligned, compensated output data signal and a synchronous data clock signal. The serially encoded input signal is received at an input delay module 22 which comprises a delay line that generates 'n' phase shifted signals $S_k$ referred to herein as "delayed input replicas". These signals are fed via a line 23 to a multiplexing circuit 28 where one of the signals is selected for ultimate transfer from the compensating DPA as a "phase aligned data output" signal. Although not shown, appropriate data sampling and delay registers would be utilized along line 23 such that the input replicas are appropriately timed and delivered to the multiplexing circuit as a signal M(k) substantially simultaneous with an output selection control signal generated as described below.

The input replicas are also provided as one input to a phase sampling flip-flop circuit 24 which also receives as input a sampling clock signal (sclk). Phase sampling flip-flops 24 provide the 'n+1' phase state variables (also referred to as "lead-lag phase states"). Sampling clock 'sclk' is produced by a sampling clock phase adjuster circuit 30 which receives as input the reference clock signal and a shift sampling clock signal "SHIFT_SCLK". SHIFT_SCLK is produced by a smoothing and selection logic circuit 26 in accordance with the present invention. Smoothing and selection logic 26 receives as input the 'n+1' phase state variables and produces therefrom an output selection signal (which is provided to the N-to-1 MUX 28), the SHIFT_SCLK signal provided to sampling clock phase adjuster 30, and a lead/lag signal provided to a slip-cycle compensation retiming logic 32. Logic 26 includes certain novel smoothing and filtering processes as described below. Output from multiplexing circuit 28 is the "phase aligned data output".

In accordance with the invention, this output undergoes slip-cycle compensation and retiming in logic 32. Logic 32 also receives as inputs the lead/lag signal from smoothing and selection logic 26, the sampling clock (sclk) and the reference clock. The reference clock signal will comprise the data clock, and therefore, where applicable, the phase of the phase aligned data output signal must be modified to compensate for the phase offset added by sampling clock phase adjuster 30 in producing the sampling clock signal (sclk).

Three novel aspects of processing in accordance with the present invention are apparent from the circuitry of FIG. 2. First, a sampling clock signal is produced from the reference clock signal. The sampling clock signal might have a phase offset (e.g., 180°) from the reference clock signal depending upon the location of data transitions relative to the reference clock signal. Second, smoothing and filtering of the 'n' phase state variables are provided. Finally, slip-cycle compensation of the phase aligned data output, along with retiming logic, are described to phase align the selected data output to the reference clock signal rather than the sampling clock signal.

Figure 3:
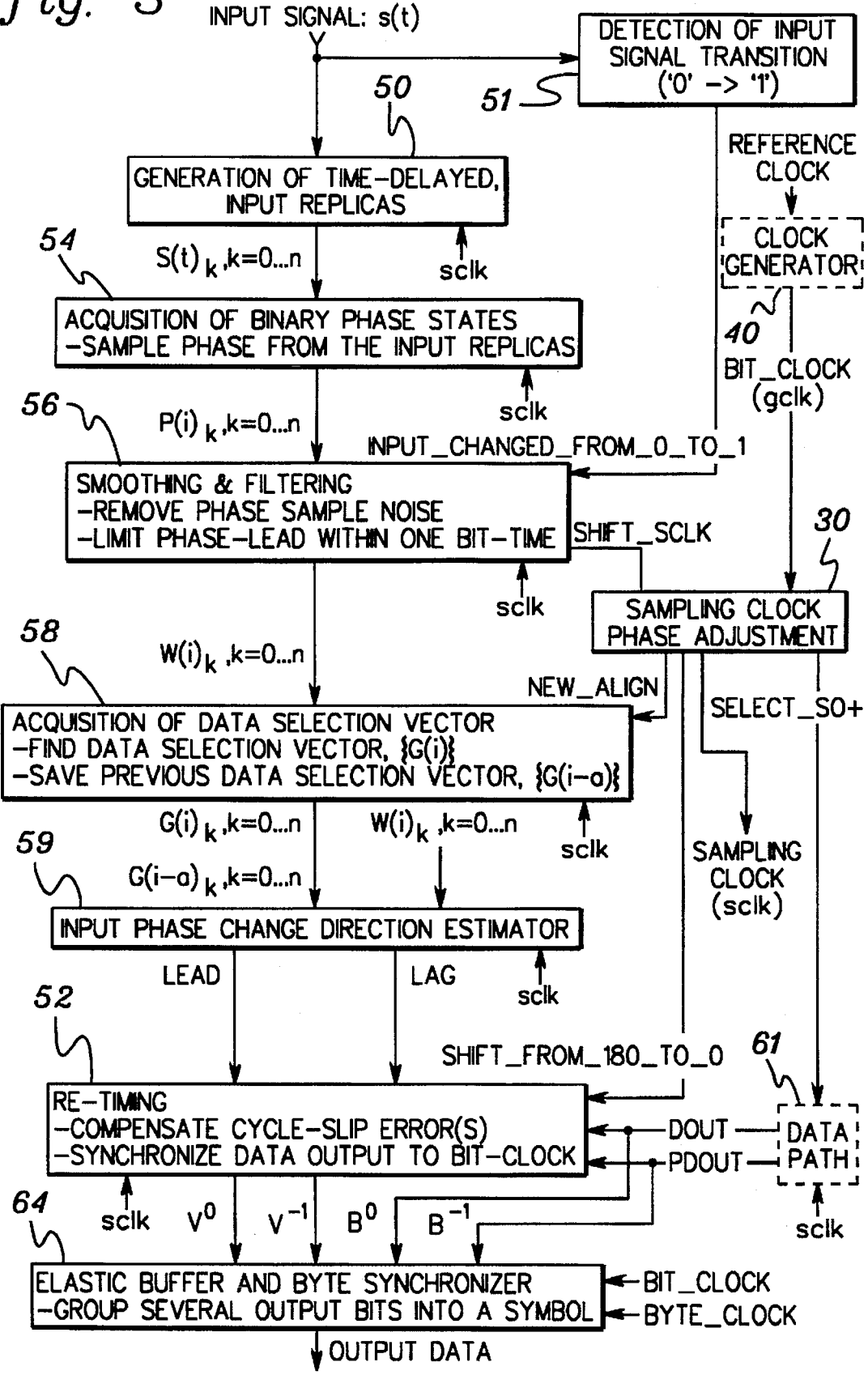
FIGS. 3, 3a & 3b are a flowchart overview of synchronization processing pursuant to the present invention.

FIG. 3 is an overview of the functional flow of a phase aligner employing bit-synchronization in accordance with the invention. A high frequency internal bit-clock (called 'gclk') is needed. Signal 'gclk' can either comprise the externally supplied, frequency-locked reference signal or a signal generated therefrom by a clock generator 40. This optional frequency multiplier can also be programmable to accommodate different data rates. The internal sampling clock (called 'sclk') is generated (sampling clock phase adjustment 30) by either re-driving the bit-clock 'gclk' resulting in an in-phase sampling clock, or shifting the phase of the 'gclk' by, for example, a half bit-time at the positive transition of the 'SHIFT_SCLK' signal provided by the smoothing/filtering algorithm 56. Phase shifting of the reference clock is employed (where appropriate) to guarantee a minimum phase difference between input signal transitions and sampling clock transitions as described below.

When an encoded input bit-stream (input signal) with an arbitrary phase offset with respect to the bit-clock (gclk) is received, the signal propagates through the input delay module 50 composed of a long chain of delay elements. Input delay module 50 has multiple (n) output taps to produce multiple delayed input signals, referred to herein as 'input replicas', each of which is sequentially offset from a preceding replica by an incremental time delay. The delay between the least delayed tap and the most delayed tap of the module, i.e., the total delay, is at least one input data bit-time interval. If there are 'n' delay-elements (i.e., 'n' delay-tabs), then $S_k$ stands for the $k^{th}$ delayed input replica produced at the $k^{th}$ delay-element of input delay module 50.

The asynchronous input bit-stream is also fed through transition detection processing 51 simultaneously with input to the delay line. From the delay line, the 'n' delayed input replicas and input signal $\{S(t)_k, k=0 \ldots n\}$ propagate in parallel along two paths, referred to herein as the 'control path' (FIG. 3) and 'data path' (see FIG. 3b). The control and data paths produce signals that are combined in a retiming logic 52. A brief overview of the phase alignment operation followed by a detailed discussion of the procedure are next provided. Phase alignment is segmented into three processing stages, namely, control processing, data processing, and retiming processing.

Figure 4:
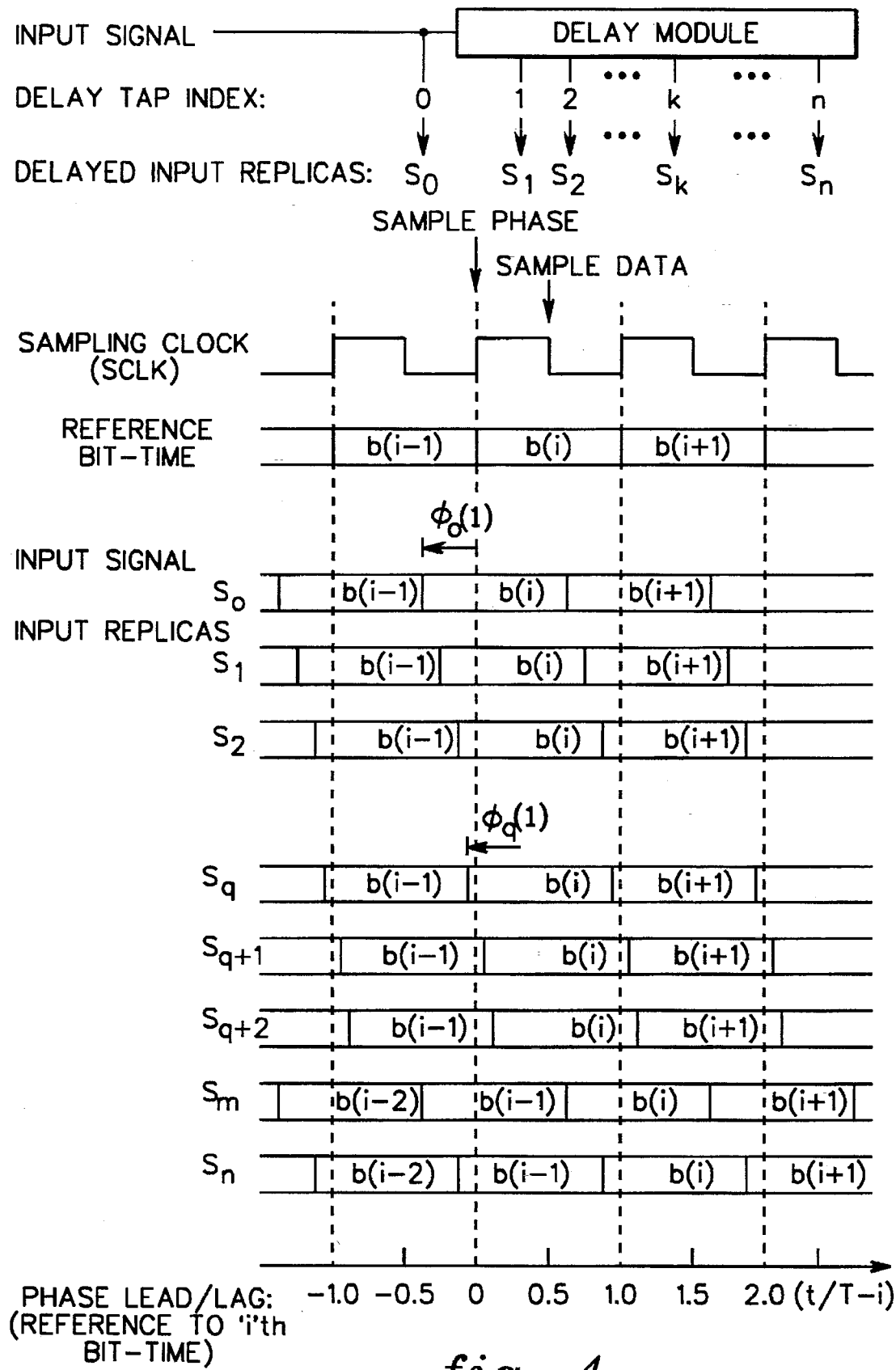
FIG. 4 is a timing diagram useful in discussing phase alignment pursuant to the present invention.

Control Processing:

The 'i'th bit-time phase alignment processing begins with a signal transition from high to low during the 'i-1'th bit-time as shown in FIG. 4, i.e., a positive transition of the sampling clock 'sclk'. (Alternatively, a signal transition in the input signal (i.e., a negative transition) could be employed without modification of the method.) With a positive signal transition in the input signal, a binary phase state-vector $\{P_k\}$ is acquired, 54 "Phase State-Vector Acquisition." Phase state-vector acquisition 54 consists of an array of binary sequential phase detectors (e.g., flip-flops) whose outputs $\{P_k\}$ represent the binary phase relationship (lead or lag) with respect to the positive transition of the sampling clock 'sclk', which (as noted) is provided by a sampling clock phase adjuster 30. Next, the phase state-vector $\{P(i)_k, k=0 \ldots n\}$ is transformed into a binary signal transition vector $\{W(i)_k, k=0 \ldots n\}$ after removal, 56 "Smoothing/Filtering," of any possible wrong phase samplings resulting from metastability in phase detector flip-flops or aliasing phase samples belonging to a previous bit-time. Aliasing phase samples may arise when the delay difference between a most delayed input replica and a least delayed input replica is larger than one bit-time interval. Signal transition vector $\{W(i)_k, k=0 \ldots n\}$ represents a noise-free, monotonic binary phase status vector relative to the positive transition of the sampling clock 'sclk'.

The transition vector $\{W(i)_k\}$ is transformed into a data selection-vector $\{G(i)_k, k=0 \ldots n\}$ by clearing all bits in vector $\{W(i)_k\}$ except (for example) for the one that corresponds to a delayed input replica having a minimum phase lead relative to the sampling clock, 58 "Acquisition of Data Selection Vector." Thereafter, binary information (lead and lag) and the direction of the phase variations of the input signal between successive phase-alignments is extracted by comparing the previous data selection vector $\{G(i-a)_k\}$, the current data selection vector $\{G(i)_k\}$, and the phase transistion vector $\{W(i)_k\}$, 59 "Input Phase Change Direction Estimators." This information is provided to retiming logic 52 for use in slip-cycle compensation.

Data Processing:

In parallel with the control processing, the delayed input replicas $\{S(i)_k\}$ are sampled and saved at every negative transition of the sampling clock 'sclk', 60 "Acquisition of Input Data Samples" (FIG. 3b), and appropriately delayed for subsequent processing along with the data selection vector $\{G(i)_k\}$ by the retiming logic 52 (FIG. 3). The first sampled data set is called an input bit-vector $\{D(i)_k, k=0 \ldots n+1\}$ and the delayed data set is labeled a delayed bit-vector $\{M(i)_k, k=0 \ldots n\}$. Output data selection is either from a current alignment, 63 "Output Data Selection (Current Alignment)," or the previous alignment, 65 "Output Data Selection (Previous Alignment)."

Retiming Processing:

Returning to FIG. 3, the results of the control processing and the data processing are combined by retiming logic 52, which in this figure is assumed to include the multiplex selection of appropriate data from the delayed bit-vector $\{M(i)_k\}$. In addition, retiming logic 52 inserts or deletes a bit if necessary to compensate for a potential cycle-slip associated with a reduced $2\pi$ phase-alignment operation. The phase-aligned output data ($B^0$ and $B^{-1}$) are loaded at the rate of the bit-clock (gclk) into a 4-bit elastic buffer, 64 "Elastic Buffer and Byte Synchronizer," under control of output control signals ($V^0$ and $V^{-1}$). When the control signal $V^0$ (or $V^{-1}$) is "true", the data on output $B^0$ (or output $B^{-1}$) is "valid". When both $V^0$ and $V^{-1}$ are "true", the data on output $B^{-1}$ precedes that on output $B^0$. When more than two bits are loaded into the elastic buffer 64, the previously loaded data bits in the elastic buffer are grouped by the byte synchronizer as a "symbol", with a "symbol" being defined as a collection of data bits which taken together comprise a primitive such as a character, byte, or control command. When enough data bits to form a symbol are accumulated by the byte synchronizer, the contents of the byte synchronizer are transferred out as a phase aligned symbol (OUTPUT DATA) to other logic within of the subsystem. Transfer occurs one symbol at a time in parallel fashion at the rate of one byte-clock (bclk).

Figure 3A:
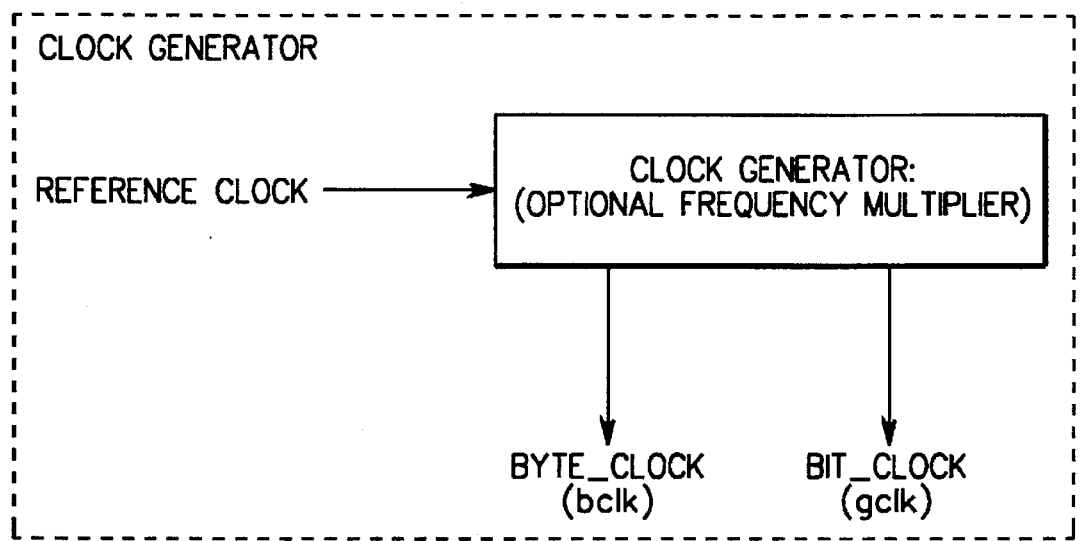
Figure 3B:
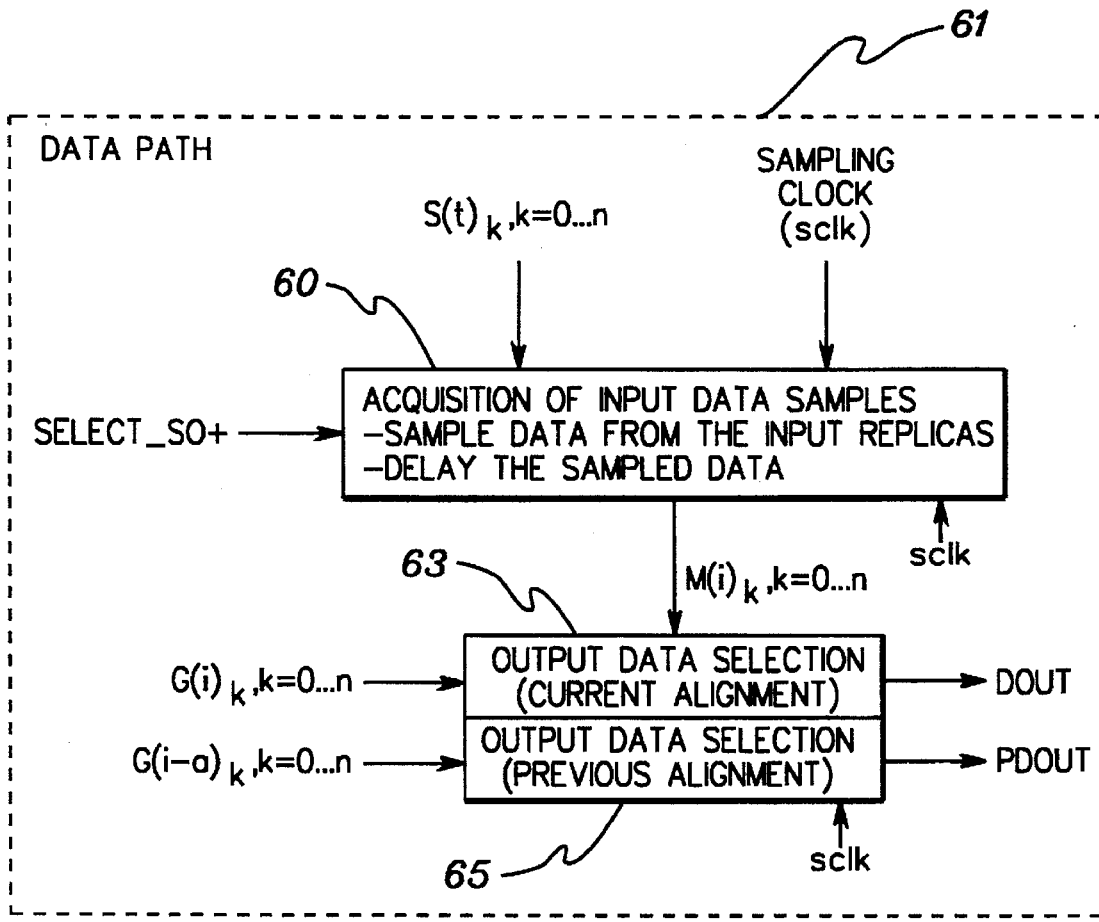

One detailed procedure of the pipelined bit-synchronized method of FIG. 3 is set forth below. FIGS. 3, 3a & 3b define the reference frame, and notations of variables used to describe the processing are summarized below.

Definitions k=Delay module output tap index (integer). The amount of delay in input replicas (i.e., output from the delay module) increases monotonically as k increases.

i=Bit-time index (integer). For example, data sampled in the '(i−1)'th bit-time precedes one sampled in the 'i'th bit-time in time domain.

a=number of bit-time intervals from one phase alignment operation to the immediately previous phase alignment operation. The phase alignment operation is triggered when the input signal transition from low to high is detected and the phase alignment operation triggered by the previous input signal transition is completed. For example, if phase alignment was triggered at 'i'th bit-time, then the most recent phase alignment occurred at the '(i−a)'th bit-time.

$\{P(i)_k\}$=A binary phase state of the 'k'th input replica belonging to the 'i'th bit-time sampled at the rising edge (positive edge) of the sampling clock, but no later than the previous rising edge of the sampling clock:

'1'=A signal transition on the 'k'th input replica occurred before the rising edge (positive edge) of the sampling clock.

'0'=A signal transition on the 'k'th input replica occurred after the rising edge (positive edge) of the sampling clock.

$\{W(i)_k\}$=A binary phase transition vector derived from the phase state vector $\{P(i)_k\}$ after smoothing and filtering processing.

$\{G(i)_k\}$=A binary data selection vector derived from the phase transition vector $\{W(i)_k\}$ after lead-lag phase transition detection processing.

$\{D(i)_k\}$=A binary input data vector sampled from the 'k'th input replica belonging to the 'i'th bit-time. The input data is sampled at the falling edge (negative edge) of the sampling clock.

$D(i)_0^+$=A binary input data vector sample (i.e., 'k=0') belonging to the 'i'th bit-time. The input data is sampled at the rising edge (positive edge) of the sampling clock.

$\{M(i)_k\}$=A binary delayed data bit vector derived from $\{D(i)_k, k=0 \ldots n\}$ and $\{D(i)_0^+\}$.

$B^0$=A binary data output selected from $\{M(i)_k\}$ using $\{G(i)_k\}$.

$B^-$=A binary data output selected from $\{M(i)_k\}$ using $\{G(i-a)_k\}$.

gclk=A bit clock.

sclk=A sampling clock whose frequency is the same as the bit clock (gclk), but whose phase relationship with respect to the bit clock is either in-phase (0° phase difference) or out-of-phase (e.g., 180° phase difference or a ½ bit-time).

SHIFT_SCLK =A binary flag indicating that the phase of the sampling clock needs a phase-shift by a ½ bit-time or 180° from the current sampling clock phase.

SHIFT_FROM_180_TO_0=A binary flag indicating that the sampling clock is in-phase with the bit clock as the result of a current 180° 'phase-shift' on the sampling clock.

SELECT_SO+=A binary flag indicating that $D(i^-)_0$ should be used instead of $D(i)_0$ for $M(i)_0$.

INPUT_CHANGED_FROM_0_TO_1=A binary flag indicating that the input signal has changed from '0' to '1'.

NEW_ALIGN=A binary flag indicating that a new phase alignment operation has started and is in progress.

$V^0$=A binary flag indicating that data output $B^0$ is valid.

$V^{-1}$=A binary flag indicating that data output $B^{-1}$ is valid.

Coded Input Signal:

By way of example, an encoded, asynchronous serial input signal s(t) is represented as a series of binary pulse trains by defining its phase relationship with respect to a receiver's reference clock as shown in FIG. 4. The amount of the phase difference $\phi^{(i)}_0$ in FIG. 4 represents the difference between the input signal and the receiver's sampling clock 'sclk' (i.e., reference phase difference measurement) during the $i^{th}$ bit-time interval. The input signal s(t) can be expressed as:

$$s(t) = \sum_{i=-\infty}^{\infty} b_i g[t - (i + \phi_0^{(i)})T]$$

where $b_i$=binary data transmitted during the $i^{th}$ bit-time by the transmitter, $m^{(i)}_0$=amount of phase difference between the 'i'th input signal and the sampling clock referenced at the beginning of the reference bit-frame, $$g(t) = \begin{bmatrix} 1 \text{ for } iT < t < (i+1)T \\ 0 \text{ for } t \leq iT \text{ or } t \geq (i+1)T \end{bmatrix}$$

T=one bit-time interval of the serial input stream.

When the input signal changes from '0' to '1' an 'Input_Changed_From_0_to_1' signal is generated to initiate phase alignment operations.

Time-Delayed Input Replicas:

The delayed input replicas $\{S(t)_k, k=0 \ldots n\}$ from the input delay module can be expressed as:

$$\{S(t)_k, k=0 \ldots n\} = \sum_{i=-\infty}^{\infty} b_i g[t - (i + \phi_k^{(i)})T]$$

where $\phi_k^{(i)} = \phi_0^{(i)} + k\phi_d$=amount of phase shifted at the $k^{th}$ delay element, $\phi_d = t_d T$=amount phase shifted by one delay element, $t_d$=inter-tap time delay in the input delay module.

The phase shift of each input replica available from the delay module is always positive, as shown in FIG. 4, and a function of the delay taps. The $m^{th}$ delay tap is defined to satisfy $m\phi_d \leq T < (m+1)\phi_d$. By maintaining the $\phi^{(i)}_0$ always negative (i.e., s(t) has a leading phase with respect to the 'i'th sampling clock), there exists a delayed input replica with a minimum leading phase (e.g., output from the $q^{th}$ delay tap (FIGS. 4 & 5b)) such that:

$$q = \text{INTEGER}\left(-\frac{\phi_o^{(i)}}{\phi_d}\right) \leq m$$

Figure 5A:
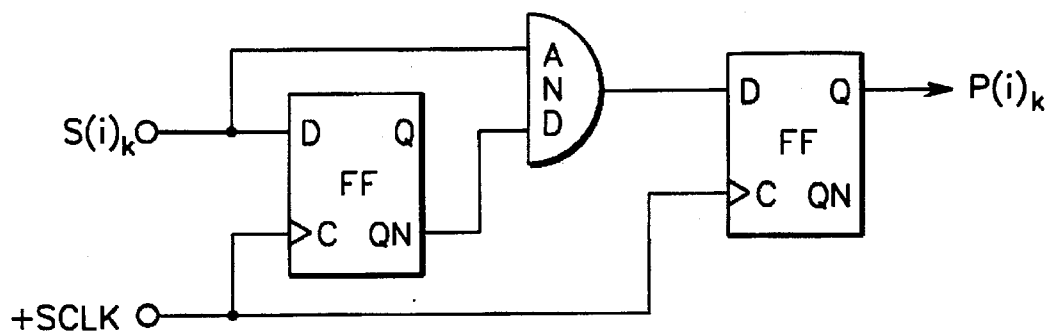
FIG. 5a depicts a phase detector employed in the compensating digital phase aligner of FIG. 2.
Figure 5B:
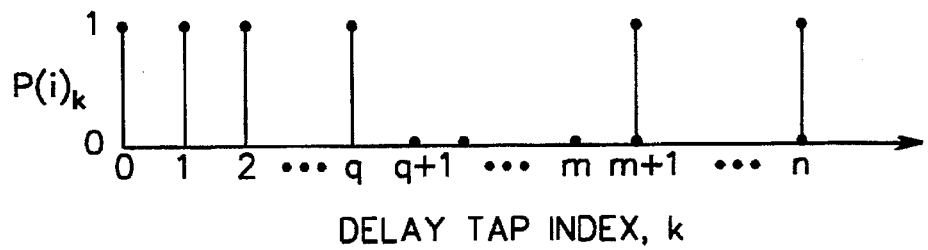
FIG. 5b graphically depicts an example of binary phase states as a function of delay tap location.

Acquisition of Binary Phase States:

The characteristics of a sequential binary phase detector are depicted in FIGS. 5a & 5b. When a signal transition (e.g., from "false" ('0') to "true" ('1')) on the input signal occurs before the positive transition of the sampling clock, the latched phase state {P(k)} is set to "true" or '1'. Otherwise, phase state {P(k)} remains at "false" or '0'.

Similarly, a set of binary phase vectors associated with the $i^{th}$ bit-time, called phase vector $\{P(i)_k, k=0 \ldots n\}$, is acquired by sampling the 'n+1' input replicas at the rising edge of the 'sclk'. The resulting $\{P(i)_k\}$ contains the status (lead or lag) of binary phase information for $\{S(t)_k, k=0 \ldots n\}$ for the $i^{th}$ bit-time. FIG. 5b shows the binary transition states as a function of the delay tap index, k. The $\{p(i)_k\}$ is determined as:

$$P(i)_k = \begin{bmatrix} 1 \text{ for } 0 \leq k \leq q \\ 0 \text{ for } q < k \leq m \end{bmatrix}$$

Smoothing & Filtering of Phase State Vector:

When 'Input_Change_From_0_to_1' signal is "true", this functional block 54 (FIG. 3) decides whether to initiate a new phase alignment operation or to shift the phase of the sampling clock.

● Sampling clock phase shift.

When a positive transition lead on the input signal s(t) is close to that of the reference (or sampling) clock, the binary phase sample $P(i)_0$ is sensitive to the presence of phase jitter and noise on the input signal. Also, there is a high probability of driving the phase sampling flip-flop corresponding to binary phase sample $P(i)_0$ into an unknown state, called a 'metastable region'.

To avoid the metastable region, the sampling clock is derived from the reference clock by shifting the phase of the reference clock a ½ bit-time with respect to the bit clock when the following conditions are true:

'Input_Changed_From_0_to_1'="true" and $P(i)_0 = 0$, or

'Input_Changed_From_0_to_1'="true", $P(i)_0 = 1$, and $P(i)_1 = 0$.

As a result, the next positive transition of the input signal occurs roughly a half-bit time earlier than the rising edge of the sampling clock. When the above condition occurs, control signal 'SHIFT_CLOCK' is set to '1' to instruct the phase shift of the sampling clock at the sampling clock phase adjustment (30).

● Initiate a new phase alignment operation

When the 'Input_Change_From_0_To_1' signal is true and there is no need to shift the phase of the sampling clock, the phase state vector $\{P(i)_k\}$ is transformed into a phase transition vector $\{W(i)_k\}$ by performing the following operations:

1. Smoothing to remove any false phase state in vector $\{P(i)_k\}$ due to phase sampling flip-flop metastability. This is accomplished by finding a integer, 'q' such that $P(i)_{q+1} = {'}0{'}$ is the first occurrence of 'phase-lag' condition by scanning the sampled phase state, $\{P(i)_k$ for $k=1 \ldots q+1\}$ 2. Filtering operation to remove any 'phase-lead' condition beyond the current bit-time by setting $P(i)_k = {'}0{'}$ ('phase-lag' condition) for $k={'}q+2{'}$ to 'n'.

3. By applying the smoothing and filtering operations to the phase state vector, the lead-lag phase transition vector $W(i)_k$ is obtained.

$$\{W(i)_k\} = \begin{bmatrix} 1 \text{ for } k = 0 \\ 0 \text{ for } k = 1 \ldots n \end{bmatrix} \text{ if SHIFT } SCLK \text{ is 'True'.}$$

$$\{W(i)_k\} = \begin{bmatrix} R_0 \cdot \prod_{r=1}^{k} \overline{(P(i)_{r-1})} + P(i)_r) \text{ or } \overline{R_0} \cdot \sum_{r=1}^{k} P(i)_{r-1} \cdot \overline{P(i)_r} \\ \text{for } k = 0 \ldots n \text{ if SHIFT } SCLK \text{ is 'False'.} \end{bmatrix}$$

where $R_0 = P(i)_0$ if a signal transition occurs during the interval $(i-1)T \leq t < iT$. Otherwise, it is set to "false".

Phase Adjuster For Sampling Clock:

When the positive transition lead on input signal s(t) is close to that of the sampling clock 'sclk', the binary phase sample $P(i)_0$ is sensitive to the presence of phase jitter or noise on the input signal. Also, there is a high probability of driving the phase sampling flip-flop for sample $P(i)_0$ into an unknown state, called the "metastable" region. When, for example, the phase lead of the input signal is such that $P(i)_0 = 1$ and $P(i)_k = 0$ for $k = 1 \ldots m$, then the phase of the reference clock is phase shifted by 180° to derive the sampling clock signal 'sclk'. Then, the phase lead at the next positive transition of the input signal is roughly a half-bit time phase lead with respect to that of the sampling clock. When this condition occurs, control signal 'SHIFT_SCLK' is "true". At the same time, when the resulting sampling clock is in-phase with the bit clock 'gclk' the phase state of the sampling clock with respect to the bit clock 'gclk', i.e., 'Shift_From_180_to_0' is set to '1'. A predefined phase shift of 180° is presented herein by way of example only. Other phase shifts might be 90°, 270° or any other preselected, fixed value. When 'SHIFT_SCLK' is "true", a control signal 'Select_SO+' is set to "true" when the sampling clock phase is shifted.

Acquisition of Data Selection Vector:

The phase transition vector is further transformed into a data selection vector $\{G(i)_k\}$ whose element is given as:

$$\{G(i)_k\} = \begin{bmatrix} 1 \text{ if } W(i)_k \neq W(i)_{k+1} \text{ for } k = 0 \ldots n-1 \\ 0 \text{ if } W(i)_k = W(i)_{k+1} \text{ for } k = 0 \ldots n-1 \\ 0 \text{ for } k = n \end{bmatrix}$$

Further, when 'NEW_ALIGN' signal is true, the previously obtained data selection vector is saved as $\{G(i-a)_k = 0 \ldots n\}$.

Input Phase Change Direction Estimator:

Using the current phase transition vector $\{W(i)_k\}$ and a set of data selection vectors (i.e., the previous selection vector $\{G(i-a)_k\}$ and current selection vector $\{G(i)_k\}$, the direction of the phase change is found as follows:

1. No change if $\delta(i)^0$ is "true" where:

$$\delta(i)^0 = \sum_{k=0}^{n} G(i-a)_k G(i)_k$$

2. Change in the direction of leading phase with respect to the sampling clock if $\delta(i)^+$ is "true", where:

$$\delta(i) = \overline{\delta(i)^0} \sum_{k=0}^{n} G(i-a)_k W(i)_k$$

3. Change in the direction of lagging phase with respect to the sampling clock if $\delta(i)^+$ is "true", where:

$$\delta(i)^+ = \overline{\delta(i)^0} \sum_{k=0}^{n} G(i-a)_k W(i)_k$$

Figure 6:
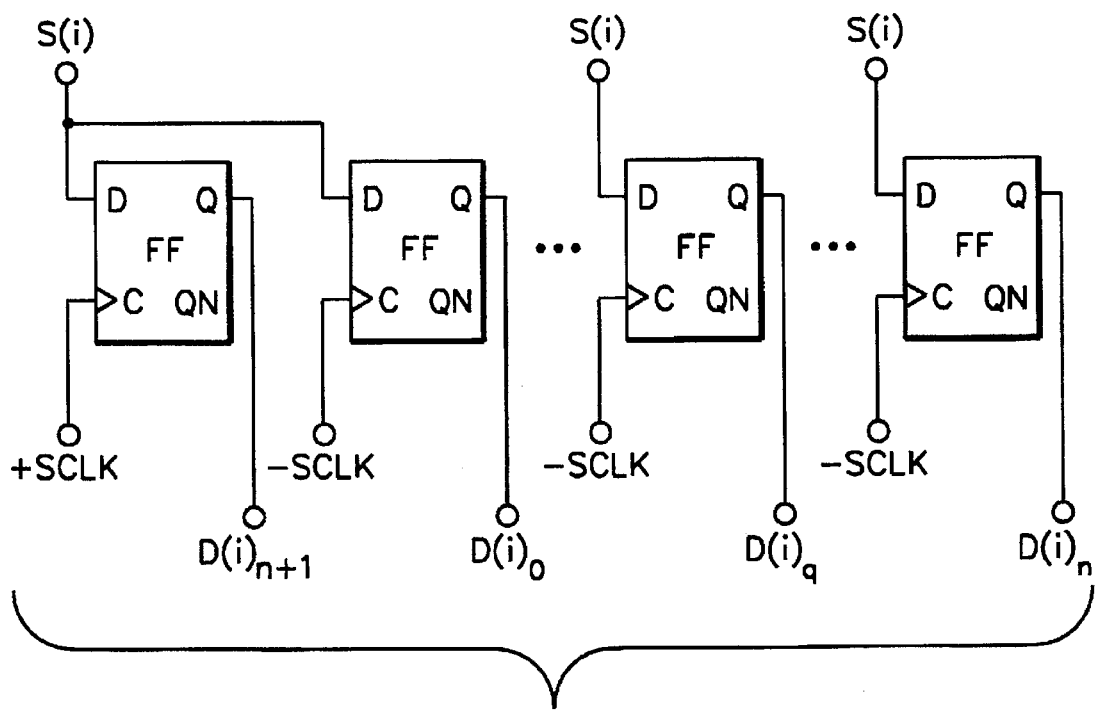
FIG. 6 is a block diagram of data sampling circuits employed by the compensating digital phase aligner of FIG. 2.

Acquisition of Input Data Samples:

The 'n+1' delayed input replicas are sampled at every negative transition of the sampling clock using data sampling circuits 60 shown in detail in FIG. 6. Data sampling circuits 60 produce an input bit-vector with 'n+2' data samples. The last sampled, $D(i)_{n+1}$ (=$D(i)_0^+$), is obtained by sampling the input signal (i.e., k=0) at the positive transition of the sampling clock 'sclk'. The $D(i)_{n+1}$ is only used in conjunction with the phase shift in the sampling clock. The input bit-vector is delayed by the next two sampling clock cycles to synchronize with the control flow. The delayed bit-vector $\{M(i)_k\}$ can be expressed as:

$M(i)_k = D(i)_k$ for k=1 ... n $M(i)_0 = D(i)_0$ if SHIFT_SO+ is "false" $D(i)_{n+1}$ if SHIFT_SO+ is "true"

Output Data Selection:

Two outputs are produced as follows:

DOUT (=$B^0$) is selected from the delayed bit-vector using the current, newly formed data selection vector:

$$B^o = DOUT = \sum_{k=0}^{n} G(i)_k M(i)_k$$

PDOUT (=$B^{-1}$) is found from the delayed bit-vector using the previously formed data selection vector:

$$B^{-1} = PDOUT = \sum_{k=0}^{n} G(i-a)_k M(i)_k$$

Figure 7:
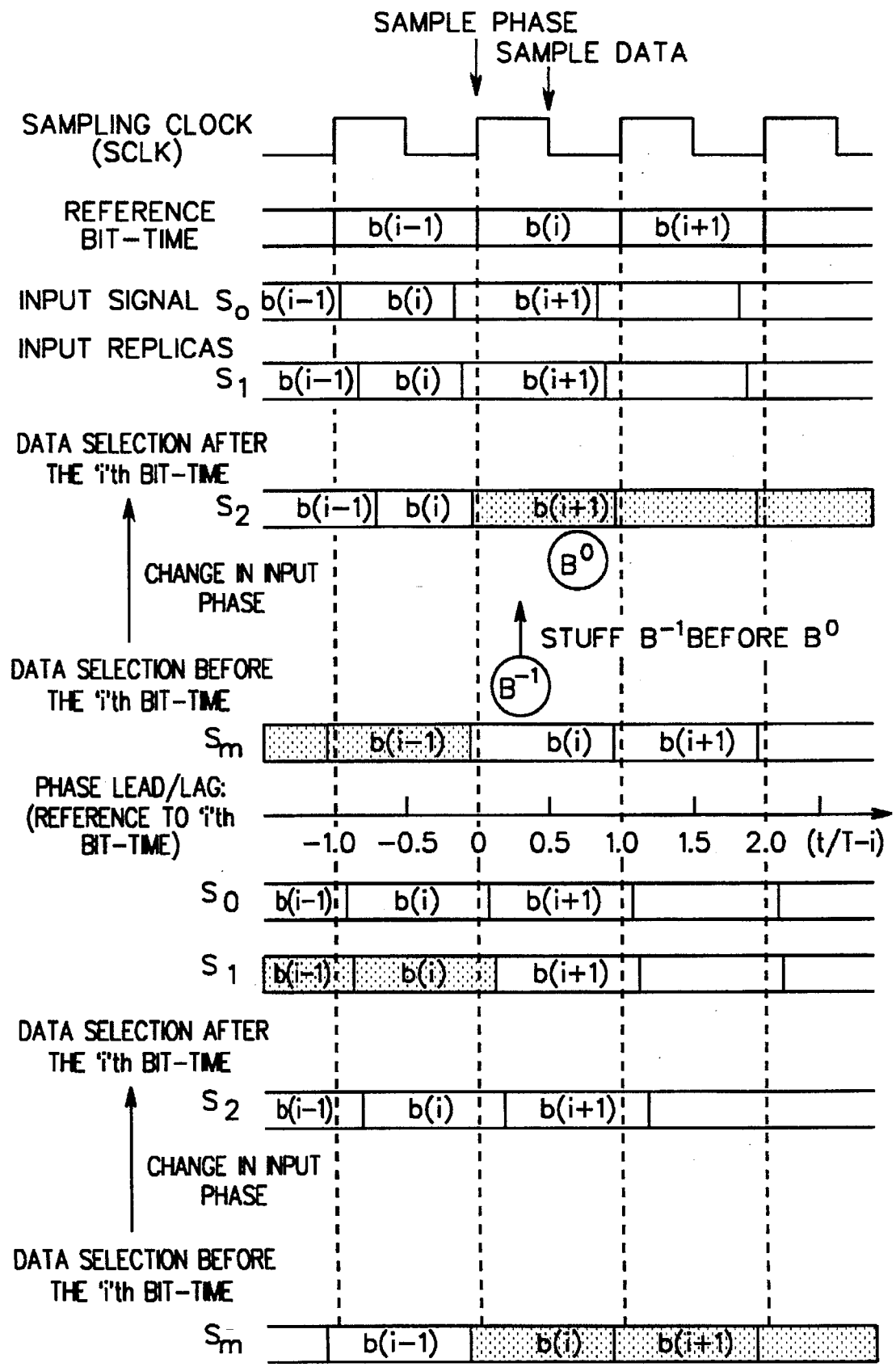
FIG. 7 is a timing diagram useful in describing slip-cycle compensation pursuant to the present invention.

Retiming:

The retiming logic combines the control and data samples to, for example, select an output with a minimum phase lead. (A minimum phase lag could alternatively be used.) This logic also performs compensation for any cycle slip due to the phase shift in the sampling clock 'sclk' or a reduced one bit-time phase error process as shown in FIG. 7. The two output data from the retiming logic are given as:

$$B^0(i) = \sum_{k=0}^{n} G(i)_k M(i)_k$$

$$B^{-1}(i) = \sum_{k=0}^{n} G(i-a)_k M(i)_k$$

The two output control signals are:

$V^0(i)$=a binary value which indicates the validity of the binary data on line $B^0(i)$ $V^{-1}(i)$=a binary value which indicates the validity of the binary data on line $B^{-1}(i)$.

The $V^0(i)$ and $V^{-1}(i)$ are determined as follows:

●The binary values of $V^0(i)$ is set to "false" if

1. $\{P_0^{(i)}\delta_{(i)}^+ B^0(i-1)B^0(i)\}$ is "true", or
2. When the phase of the sampling clock is changed from out-of-phase to in-phase with the bit clock.

Otherwise, set $V^0(i)$ to "true".

●The binary values of $V^{-1}(i)$ is set "true" only if:

$P(i)_0 \delta_{(i)} \overline{B^{-1}(i)} B^0(i)$ is "true".

Otherwise, set $V^{-1}(i)$ to false.

Elastic buffer and Byte Synchronizer:

The elastic buffer provides elasticity for instantaneous differences in phase or small random frequency variations between the input data rate and the internal bit-clock frequency. At every bit-clock period, the output from the bit-phase aligner is loaded into the elastic buffer based on the status of the two control signals.

●Load no data when $V^0$ is "false".
●Load DOUT only when $V^0$ is '1' and $V^{-1}$ is '0'.
●Load DOUT and PDOUT when $V^0$ is '1' and $V^{-1}$ is '1' in such a way that the PDOUT bit precedes the DOUT bit.

The length of the elastic buffer should be larger than 4-bits. The symbol-phase aligner (byte synchronizer) is to detect a particular bit sequence (i.e., synchronization pattern or symbol) by scanning the contents of the elastic buffer. When the synchronization symbol is detected, the received bits in the elastic buffer are grouped as a symbol and moved in parallel for further processing within the subsystem.

To summarize the above discussion, synchronization in accordance with the present invention can be accomplished as an all digital implementation. Further, pipeline processing makes feasible high speed VLSI technology implementations, such as GaAs or CMOS. The synchronization technique reduces effects of sampling flip-flop metastability, random jitter on the input signal and VLSI process variations inherent in the delay line. Processing neither relies on precision analog components nor requires complex signal processing techniques. Data output can be resynchronized within a few bit-times after transition of the input data signal. Compensation for both negative and positive cycle slips due to momentary large changes in input signal phase is also provided.

As noted initially, data phase aligning in accordance with the present invention can be employed in a number of applications. For example, the aligning method may comprise a multichannel digital phase aligner, a bus deskewing aligner, or be used in an integrated multiple transceiver for retrieving data from a serialized encoded bit stream. The later of these options is discussed in detail below with reference to FIG. 8.

Figure 8:
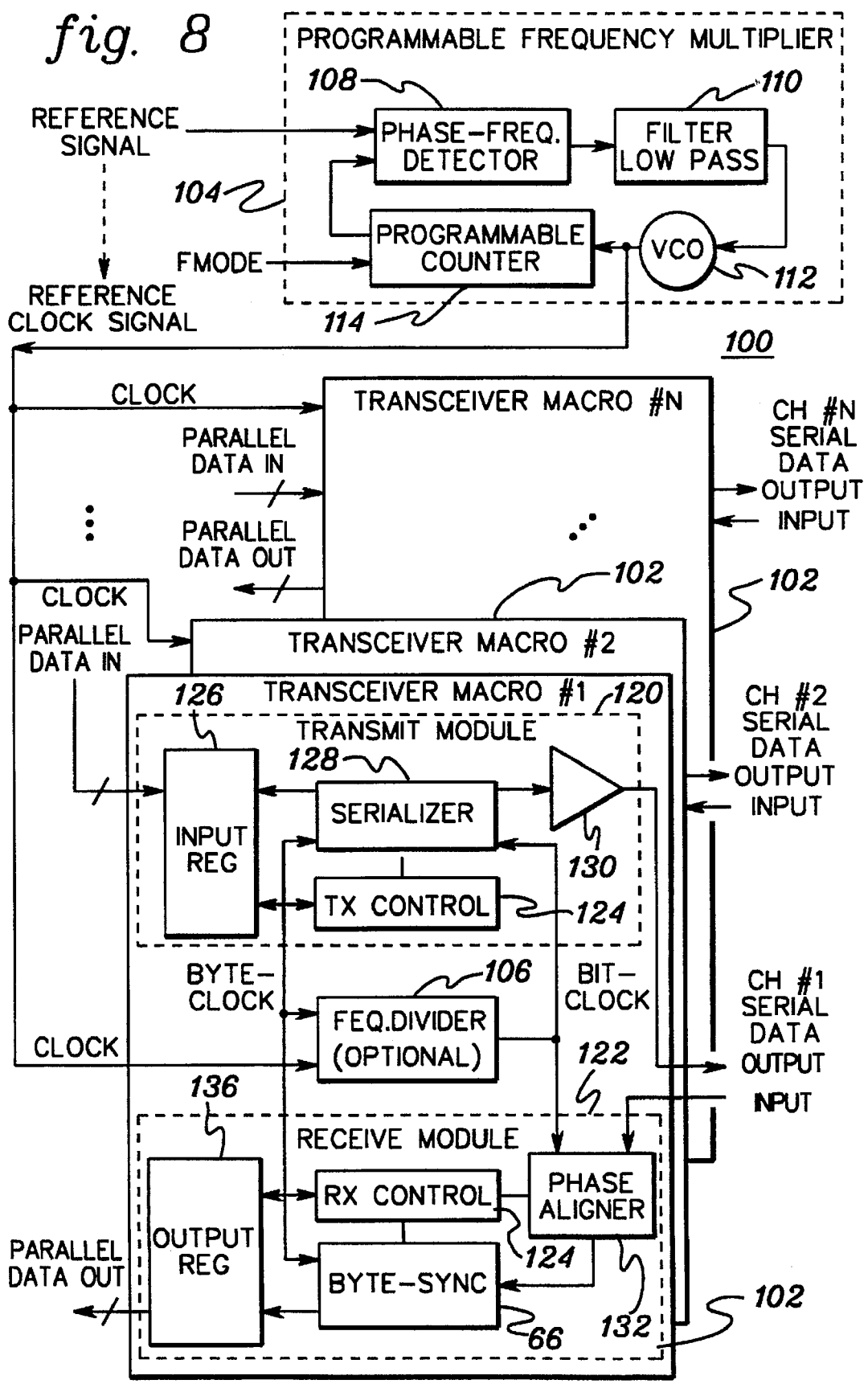
FIG. 8 is a block diagram of an integrated transceiver module having multiple transceiver macros each of which employs digital phase alignment in accordance with the present invention.

The architecture of one embodiment of a programmable multichannel integrated transceiver 100 is shown in FIG. 8. Integrated transceiver 100 consists of multiple transmit/receive macros 102 and a single (optional) programmable frequency multiplier 104. Each transceiver macro services one duplex communication channel concurrently and shares the same reference clock signal, originating from either an external reference signal generator (not shown) or internal frequency multiplier 104. Each transceiver macro 102 could operate at the same data rate or a unique data rate by loading an appropriate frequency division factor into its corresponding channel-data-rate register 106.

Programmable frequency multiplier 104 receives as input a system reference signal which is fed to a phase frequency detector 108. Output of detector 108 feeds a voltage controlled oscillator 112, after being filtered through a low pass filter 110. Output from the voltage controlled oscillator 112 is the reference clock signal employed by the transceiver macros. Feedback is completed via programmable counter 114 which receives a multiplication control signal 'FMODE' which controls the gain of programmable frequency multiplier 104.

When used, the frequency multiplier can be a PLL based frequency multiplying circuitry (as shown in FIG. 8) or a circuit implementing any well-known frequency multiplying technique. When all transceivers are operating at the same data rate, the frequency of the bit-clock (i.e., the reference clock signal output from the frequency multiplier 104) can be set to a desired integer-multiple of the reference signal by loading an appropriate frequency multiplication factor (i.e., 1, 5, or 10, etc.) into a programmable counter 114 in multiplier 104 through setting an appropriate value on the FMODE control. The frequency multiplier produces a bit-clock (gclk) to send and receive coded serial data and a byte-clock (bclk) to transfer data in parallel. The byte-clock is derived from the bit-clock by dividing the bit-clock by the width of the parallel data bus.

Each transceiver macro 102 has transmitter 120 and receiver 122 modules and an optional frequency divider 106. When it is desired to operate a transceiver macro 102 at a different data rate, the frequency multiplier produces the highest frequency bit-clock used in the transceiver macros and each macro produces its own bit and byte clock by appropriate frequency division of the reference signal at its corresponding divider 106.

Each transmitter module 120 includes a transmit controller 124, input register 126, parallel-to-serial shift register (serializer) 128, and a link output driver 130. When an external send request signal is asserted, transmit controller 124 initiates the data transmit operations and coordinates data flow including: loading of parallel data into the input register 126, serializing the parallel output from the input register, and driving the serial output to the external link.

The receiver module 122 comprises a phase aligner 132 (in accordance with the above discussion), a byte synchronizer 66, a receiver controller 134 and an output register 136. The phase aligner retrieves data from an asynchronous serial input data stream using the method disclosed above and produces a phase aligned data bit stream at the rate of the bit-clock. The retrieved data bit stream is first converted into parallel data and grouped into a meaningful primitive, a process referred to above as symbol alignment. The byte aligned data is then latched into the output register at the rate of the byte-clock. The contents of the output register 136 are transferred to the subsystem's parallel data bus as parallel data output.

From the described transceiver embodiment, those skilled in the art will note that the central concepts presented herein are applicable to synchronization of multiple input bit-streams with respect to a reference clock signal to perform functions such as bus deskewing, combining of striped data from multiple links and the integration of multiple transceivers on a single semiconductor chip. A digital phase aligner in accordance with the invention is easily integrated with other synchronous components within a subsystem of a communications or digital system. Implementation is cost effective for repeated use of the synchronization technique as a building block within the system.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A transceiver circuit for a subsystem of a system wherein data is transferred along multiple channels asynchronously among a plurality of subsystems, said transceiver circuit comprising:

multiple transceiver macros, each transceiver macro being coupled to a different one of the multiple channels, and comprising a receiver circuit and a transmitter circuit, each receiver circuit having a digitally implemented phase aligner for aligning an input signal with a reference clock signal for subsequent synchronous data operations within the subsystem of the plurality of subsystems; and means, coupled to each of the multiple transceiver macros, for generating the reference clock signal from one of a plurality of reference clock signals, wherein each receiver circuit of said multiple transceiver macros may receive the reference clock signal such that at least some unique reference clock signals of different frequency are provided.

2. The transceiver circuit of claim 1, wherein said means for generating the reference clock signal includes a programmable frequency multiplier connected to clock each of said multiple transceiver macros.

3. The transceiver circuit of claim 2, wherein each of said multiple transceiver macros includes its own frequency divider coupled to the programmable frequency multiplier.

4. A data transfer network wherein data is transferred along multiple channels asynchronously among a plurality of subsystems, said network comprising:

multiple synchronous subsystems, each synchronous subsystem having a transceiver circuit comprising (i) multiple transceiver macros, each transceiver macro being coupled to a different one of the multiple channels, and comprising a receiver circuit and a transmitter circuit, each receiver circuit having a digitally implemented phase aligner for aligning a received input signal with a reference clock signal for subsequent synchronous data operations within the subsystem of the multiple subsystems, and (ii) means, coupled to said multiple transceiver macros, for generating the reference clock signal from one of a plurality of reference clock signals, wherein each receiver circuit of said multiple transceiver macros may receive the reference clock signal such that at least some unique reference clock signals of different frequency are provided to the multiple transceiver macros; and said multiple channels coupling said plurality of subsystems.

5. The network of claim 4, wherein said means for generating the reference clock signal comprising a programmable frequency multiplier connected to clock each of said multiple transceiver macros.

* * * * *

UNITED STATES PATENT AND TRADEMARK OFFICE
CERTIFICATE OF CORRECTION

PATENT NO.: 5,668,830

DATED: September 16, 1997

INVENTOR(S): Georgiou et al.

It is certified that error appears in the above-identified patent and that said Letters Patent is hereby corrected as shown below:

Col. 10, line 60, "$\phi_d \equiv t_d T$ = amount phase shifted by one delay element," should read --$\phi_d \equiv t_d/T$ = amount phase shifted by one delay element,--.

Column 11, Line 20, "The $\{p(i)_k\}$ is determined as:" should read --The $\{P(i)_k\}$ is determined as:--.

Column 11, line 53, "hew" should read --new--.

Column 12, lines 61-63, "2. Change in the direction of leading phase with respect to the sampling clock if $\delta(i)^+$ is "true", where:

$$\delta(i) = \overline{\delta(i)^0} \sum_{k=0}^{n} G(i-a)_k W(i)_k \quad \text{"}$$

should read

--2. Change in the direction of leading phase with respect to the sampling clock if $\delta(i)^-$ is "true", where:

$$\delta(i)^- = \overline{\delta(i)^0} \sum_{k=0}^{n} G(i-a)_k W(i)_k \quad \text{--.}$$

UNITED STATES PATENT AND TRADEMARK OFFICE
CERTIFICATE OF CORRECTION

PATENT NO. : 5,668,830
DATED : Sept. 16, 1997
INVENTOR(S) : Georgiou, et al

It is certified that error appears in the above-indentified patent and that said Letters Patent is hereby corrected as shown below:

Column 13, line 62, "• The binary values of $V^{-1}(i)$ is set "true" only if:

$$P(i)_0 \delta_{(i)} \overline{B^{-1}(i)} B^0(i) \ is "true". \ "$$

should read

--• The binary values of $V^{-1}(i)$ is set "true" only if:

$$P(i)_0 \delta_{\overline{(i)}} \overline{B^{-1}(i)} B^0(i) \ is "true". \ --.$$

Signed and Sealed this

Fourteenth Day of July, 1998

*Attest:*

BRUCE LEHMAN

*Attesting Officer*  Commissioner of Patents and Trademarks